United States Patent [19]
Yuuki

[11] Patent Number: 5,618,349
[45] Date of Patent: Apr. 8, 1997

[54] THERMAL TREATMENT WITH ENHANCED INTRA-WAFER, INTRA-AND INTER-BATCH UNIFORMITY

[75] Inventor: Tomohiro Yuuki, Hamamatsu, Japan

[73] Assignee: Yamaha Corporation, Hamamatsu, Japan

[21] Appl. No.: 279,744

[22] Filed: Jul. 22, 1994

[30] Foreign Application Priority Data

Jul. 24, 1993 [JP] Japan .................................. 5-202701

[51] Int. Cl.[6] .................................................. C23C 16/00
[52] U.S. Cl. .................................. 118/715; 118/723 MP; 438/935
[58] Field of Search ..................................... 437/239, 238; 118/715, 723 MP, 725; 204/192.35

[56] References Cited

U.S. PATENT DOCUMENTS

| | | | |
|---|---|---|---|
| 4,098,923 | 7/1978 | Alberti et al. | 427/85 |
| 4,134,817 | 1/1979 | Bourdon | 204/192.35 |
| 4,310,380 | 1/1982 | Flamm et al. | 156/643 |
| 4,362,632 | 12/1982 | Jacob | 156/345 P |
| 4,369,031 | 1/1983 | Goldman et al. | 437/81 |
| 4,397,724 | 8/1983 | Moran | 204/192 E |
| 4,745,088 | 5/1988 | Inoue et al. | 437/101 |
| 4,838,983 | 6/1989 | Schumaker et al. | 437/231 |
| 5,210,466 | 5/1993 | Collins et al. | 156/345 D |
| 5,266,153 | 11/1993 | Thomas | 156/643 |

FOREIGN PATENT DOCUMENTS 0040937  3/1982  Japan .................................. 437/239

OTHER PUBLICATIONS

Wolf, Stanley, et al., "Silicon Processing For The VLSI Era", vol. 1, Lattice Press.

*Primary Examiner*—Nam Nguyen
*Assistant Examiner*—FeLisa Garrett
*Attorney, Agent, or Firm*—Loeb & Loeb LLP

[57] ABSTRACT

A process tube is surrounded by a heater. A number of gas inlet holes and a number of gas outlet holes are formed in the side wall of the process tube, the gas inlet and outlet holes facing each other and formed distributed in the longitudinal direction of the process tube. An oxidizing gas is supplied from a gas supply pipe to the gas inlet holes, and exhausted to a gas exhaust pipe via the gas outlet holes or lower gas outlet holes.

40 Claims, 8 Drawing Sheets

FIG.7

| STEP | | SET VALUE OF TEMP. | TIME | SET VALUE OF GAS VOLUME | | | STATE OF CONTROL VALVES | | | |
|---|---|---|---|---|---|---|---|---|---|---|
| | | | | N₂ | H₂ | O₂ | V1 | V2 | V3 | V4 |
| BOAT UNLOAD | | 800°C | 6min | 20 l/min | — | 0.6 l/min | OP | CL | CL | OP |
| BOAT COOL | | | 10min | 20 l/min | — | 0.6 l/min | OP | CL | CL | OP |
| WAFER CHARGE | | | 18min30sec | 20 l/min | — | 0.6 l/min | OP | CL | CL | OP |
| BOAT LOAD | | | 24min | 20 l/min | — | 0.6 l/min | OP | CL | CL | OP |
| PREHEAT | | | 30min | 10 l/min | — | 0.6 l/min | OP | CL | CL | OP |
| | t1~t2 | | 1min47sec | 10 l/min | — | — | OP | CL | CL | OP |
| | t2~t3 | | 13sec | 10 l/min | — | SLOW START→ INCREASE FLOW RATE | OP | CL | CL | OP |
| | t3~t4 | | 10sec | — | — | 3 l/min | OP | CL | CL | OP |
| | t4~t5 | | 10sec | — | SLOW START | 3 l/min | OP | CL | CL | OP |
| PYROGENIC COMBUSTION | t5~t6 | | 9.9sec | — | INCREASE FLOW RATE | 3 l/min | OP | CL | CL | OP |
| | t6~t7 | | 30sec | — | 3 l/min | 3 l/min | OP | CL | CL | OP |
| | t7~t8 | | 10sec | — | INCREASE FLOW RATE TO A SET VALUE | INCREASE FLOW RATE TO A SET VALUE | OP | CL | CL | CL |
| | t8 | | 10sec | — | 10 l/min | 10 l/min | CL | OP | OP | CL |
| WET OXIDATION | | | 6min | — | 10 l/min | 10 l/min | OP | CL | OP | OP |
| PYROGENIC EXTINGUISHMENT (1) | | | 13sec | 2 l/min | 10 l/min | 10 l/min | OP | CL | CL | OP |
| PYROGENIC EXTINGUISHMENT (2) | | | 30sec | 10 l/min | — | 10 l/min | OP | OP | OP | OP |
| PYROGENIC EXTINGUISHMENT (3) | | | 30sec | 10 l/min | — | — | OP | OP | OP | OP |
| POST ANNEAL | | | 15min | 10 l/min | — | — | OP | CL | CL | OP |
| BOAT UNLOAD | | | 18min | 20 l/min | — | — | OP | CL | CL | OP |
| BOAT COOL | | | 10min | 20 l/min | — | — | OP | CL | CL | OP |
| WAFER DISCHARGE | | | 18min30sec | 20 l/min | — | — | OP | CL | CL | OP |
| BOAT LOAD | | | 6min | 20 l/min | — | — | OP | CL | CL | OP |

FIG. 8

| STEP | | SET VALUE OF TEMP. | TIME | SET VALUE OF GAS VOLUME | | | STATE OF CONTROL VALVES | | | |
|---|---|---|---|---|---|---|---|---|---|---|
| | | | | N2 | H2 | O2 | N2O | V1 | V2 | V3 | V4 |
| BOAT UNLOAD | | 800°C | 6min | 20 l/min | — | 0.6 l/min | — | OP | CL | CL | OP |
| BOAT COOL | | | 10min | 20 l/min | — | 0.6 l/min | — | OP | CL | CL | OP |
| WATER CHANGE | | | 18min30sec | 20 l/min | — | 0.6 l/min | — | OP | CL | CL | OP |
| BOAT LOAD | | | 24min | 20 l/min | — | 0.6 l/min | — | OP | CL | CL | OP |
| PREHEAT | | | 30min | 10 l/min | — | 0.6 l/min | — | OP | CL | CL | OP |
| PYROGENIC COMBUSTION | t1~t2 | | 1min47sec | 10 l/min | — | — | — | OP | CL | CL | OP |
| | t2~t3 | | 13sec | 10 l/min | — | SLOW START – INCREASE FLOW RATE | — | OP | CL | CL | OP |
| | t3~t4 | | 10sec | — | — | 3 l/min | — | OP | CL | CL | OP |
| | t4~t5 | | 10sec | — | SLOW START | 3 l/min | — | OP | CL | CL | OP |
| | t5~t6 | | 9.9sec | — | INCREASE FLOW RATE | 3 l/min | — | OP | CL | CL | OP |
| | t6~t7 | | 30sec | — | 3 l/min | 3 l/min | — | OP | CL | CL | OP |
| | t7~t8 | | 10sec | — | INCREASE FLOW RATE TO A SET VALUE | INCREASE FLOW RATE TO A SET VALUE | — | CL | OP | CL | CL |
| | t8~ | | 10sec | — | 10 l/min | 10 l/min | — | CL | OP | CL | CL |
| WET OXIDATION | | | 4min | — | 10 l/min | 10 l/min | — | CL | OP | CL | CL |
| PYROGENIC EXTINGUISHMENT(1) | | | 13sec | 2 l/min | 10 l/min | 10 l/min | — | OP | CL | CL | CL |
| PYROGENIC EXTINGUISHMENT(2) | | | 30sec | 10 l/min | — | 10 l/min | — | OP | CL | CL | CL |
| PYROGENIC EXTINGUISHMENT(3) | | | 30sec | 10 l/min | — | — | — | OP | CL | CL | CL |
| RAMP UP (+10°C/min) | | 800°C→950°C | 15min | 10 l/min | — | — | — | OP | CL | CL | CL |
| PREHEAT | | 950°C | 10min | 10 l/min | — | — | — | OP | CL | CL | CL |
| OXINITRIDATION (1) | | | 10sec | — | — | — | 10 l/min | CL | CL | OP | CL |
| OXINITRIDATION (2) | | | 2min | — | — | — | 10 l/min | CL | CL | OP | CL |
| POST ANNEAL (1) | | | 30sec | 10 l/min | — | — | — | OP | CL | CL | CL |
| POST ANNEAL (2) | | | 4min30sec | 10 l/min | — | — | — | OP | CL | CL | CL |
| RAMP DOWN (-5°C/min) | | 950°C→800°C | 30min | 10 l/min | — | — | — | OP | CL | CL | CL |
| BOAT UNLOAD | | 800°C | 18min | 20 l/min | — | — | — | OP | CL | CL | CL |
| BOAT COOL | | | 10min | 20 l/min | — | — | — | OP | CL | CL | CL |
| WAFER DISCHARGE | | | 18min30sec | 20 l/min | — | — | — | OP | CL | CL | CL |
| BOAT LOAD | | | 6min | 20 l/min | — | — | — | OP | CL | CL | OP |

THERMAL TREATMENT WITH ENHANCED INTRA-WAFER, INTRA-AND INTER-BATCH UNIFORMITY

BACKGROUND OF THE INVENTION a) Field of the Invention

The present invention relates to thermal treatment, and more particularly to thermal treatment for the oxidation, diffusion, and the like to be performed on semiconductor wafers.

b) Description of the Related Art

A vertical type thermal treatment furnace such as shown in FIGS. 3 and 4 is known in which semiconductor wafers are subjected to an oxidation process, an impurity diffusion process, or the like.

In FIGS. 3 and 4, reference numeral 10 represents a process tube disposed upright which is made of, for example, a circular quartz tube. Although the top of the process tube 10 is closed, the top is shown broken in FIG. 3 so as to expose the interior of the process tube Two gas supply pipes 12 made of quartz and branched from a lower gas supply pipe 12o extend upward along the side wall of the process tube 10. A processing gas is introduced into the upper space of the process tube 10 via the gas supply pipes 12o and 12. By blowing out the processing gas in two directions, the uniformity of the gas in the process tube 10 is improved. As the processing gas to be used for an oxidation process, an oxidizing gas (a reaction product of $H_2$ and $O_2$, containing oxygen and water vapor) generated at an external gas burner 14 is used.

The gas introduced into the process tube 10 is exhausted from a gas exhaust pipe 16 provided at the lower portion of the process tube 10 to an exhaust system. As shown in FIG. 4, a heater 18 is mounted surrounding the gas supply pipes 12 and process tube 10.

In operation, semiconductor wafers WF supported by a wafer holder (not shown) are transported into the process tube from the bottom thereof. The bottom of the tube 10 is closed by a lid formed integrally with the wafer holder.

With the vertical type heat treatment furnace described above, however, an oxide film formed on a wafer area S (shown in FIG. 4) near the gas supply pipes 12 becomes thinner and an impurity concentration of a film near the gas supply pipes 12 becomes lower, because of the heat capacity of the gas supply pipes 12. For example, an experimental oxidation process was performed to form a thermal oxide film having a thickness of 15 nm on the surface of a silicon wafer. The film thickness at the wafer area S was thinner than the other area by 2 to 3 %.

Another problem is the long time required for processing gas replacement, or in other words, a long gas stay time in the process tube, because the processing gas is introduced into the upper space of the process tube 10 and then exhausted from the lower portion thereof.

An increased gas flow rate has been proposed the shorten the gas replacement time. However, this method poses the problem of an increased variation of oxide film thickness in the wafer plane at the lower portion of the furnace, as shown in FIG. 5 which shows the relationship between an H2 flow rate on the abscissa and a variation of oxide film thickness in a wafer plane on the ordinate. In the experiment shown in FIG. 5, mixing rates of $H_2$ and $O_2$ are kept constant. Curves SB, SC, and ST represent film thickness variations at the lower, middle, and upper portions of the furnace, respectively.

As seen from the graph of FIG. 5, the oxide film thickness variation is larger at the furnace lower portion than at the furnace middle and upper portions. This means that the reaction conditions (water vapor concentration, reaction time, and the like) change with the position in the furnace and that there is an intra-batch process variation. There is also a large inter-batch process variation because a gas replacement is performed at each oxidation process.

SUMMARY OF THE INVENTION

It is an object of the present invention to provide novel heat treatment capable of shortening a gas replacement time and reducing an intra wafer process variation and intra- and inter-batch process variations.

According to one aspect of the present invention, there is provided a method of manufacturing a semiconductor device, comprising the steps of: loading semiconductor wafers into a furnace, the furnace having an inner tube having a hollow space therein and an outer tube sectioned into a plurality of parts each of which has a hollow space therein, wherein the inner tube and the outer tube is connected through a plurality of holes (Ha–Hd) provided in a wall of the inner tube; (b) introducing oxidizing gas species into the furnace through the plurality of holes; and (c) forming oxide films on the wafers in the oxidizing gas ambient.

A number of gas supply holes are formed in the side wall of the process tube distributed in the longitudinal direction of the tube. A processing gas is introduced into the process tube via the gas supply holes so that a gas replacement time can be considerably shortened. Since the uniformity of the reaction conditions in the furnace is improved, it is possible to reduce an intra-wafer process variation, and intra- and inter-batch process variations.

A number of gas exhaust holes formed in the side wall of the process tube, distributed in the longitudinal direction of the tube and facing the gas supply holes, can further shorten the gas replacement time. A gas heater mounted on a lower gas supply pipe for heating a processing gas prevents a low temperature gas from being introduced into the furnace, thereby further improving the uniformity of temperature distributions in the furnace.

BRIEF DESCRIPTION OF THE DRAWINGS

FIG. 7 is a diagram showing an oxidation sequence.

FIG. 8 is a diagram showing a sequence of forming an oxynitride film.

DETAILED DESCRIPTION OF THE PREFERRED EMBODIMENTS

Figure 1A:
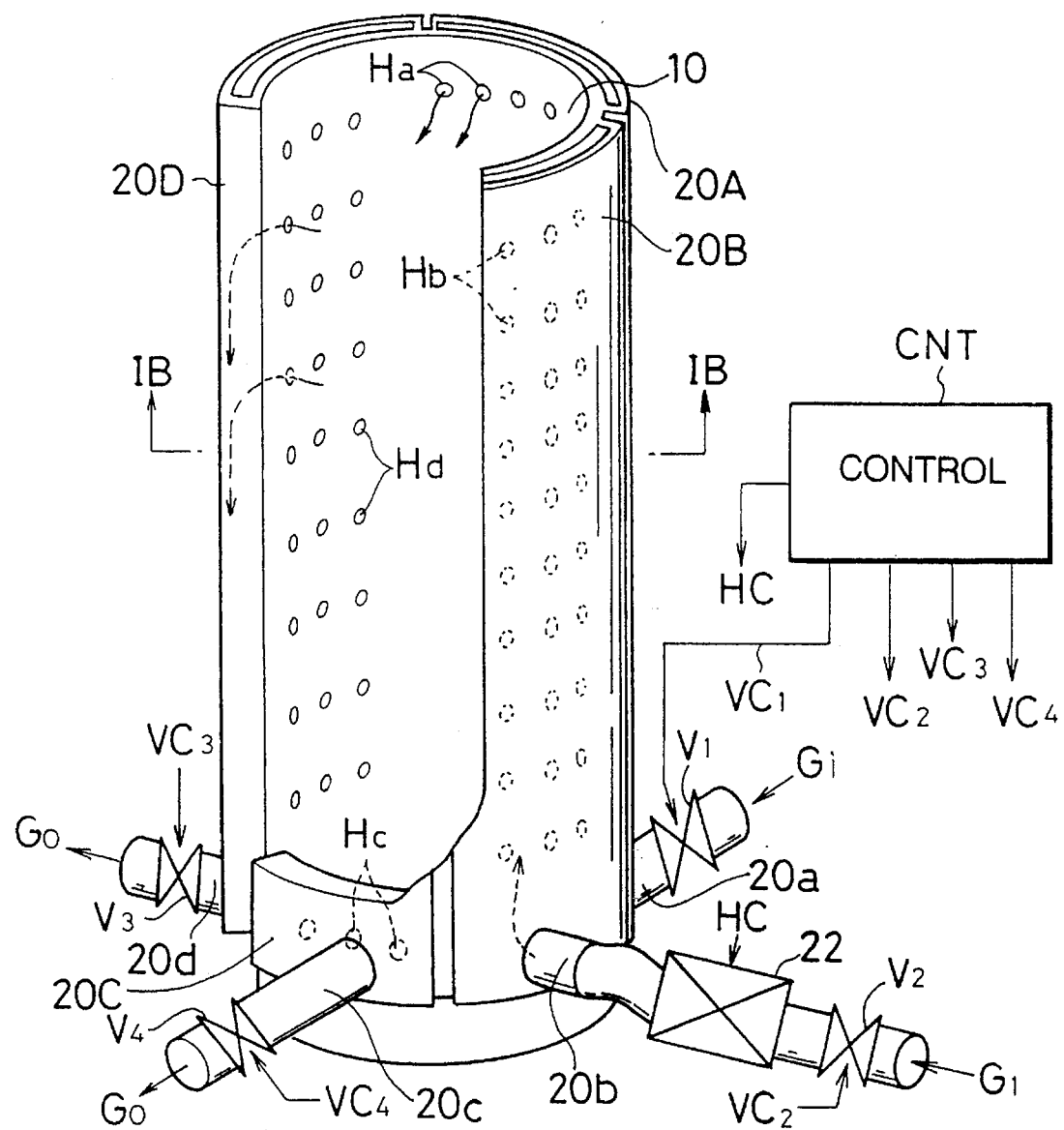
FIGS. 1A and 1B are a partially broken perspective view of a vertical type heat treatment furnace according to an embodiment of the invention, and a cross sectional view taken along line IB—IB.
Figure 1B:
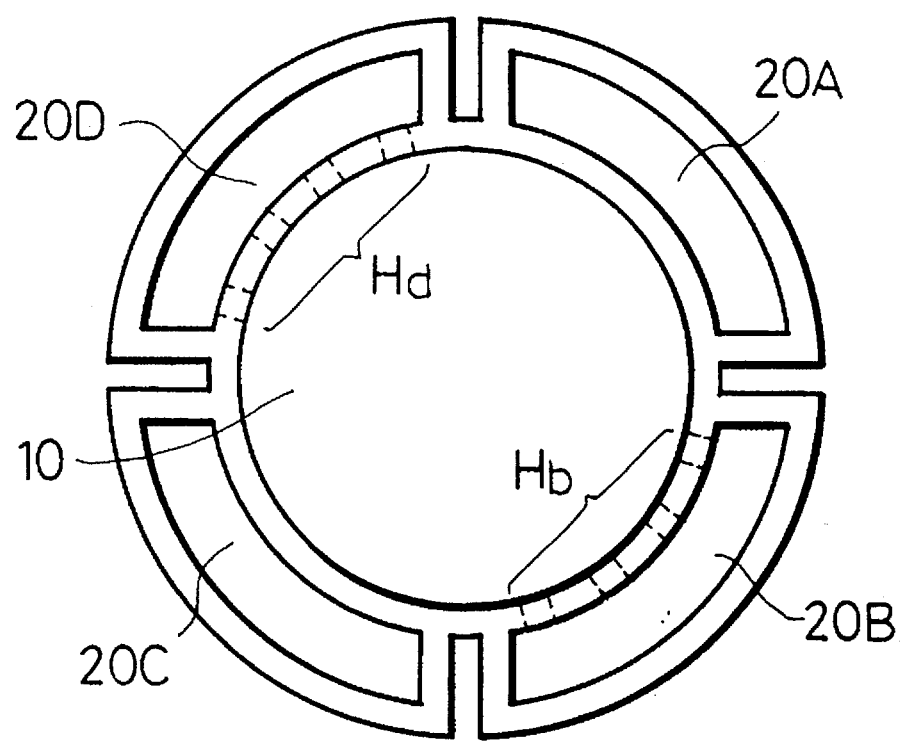
Figure 3:
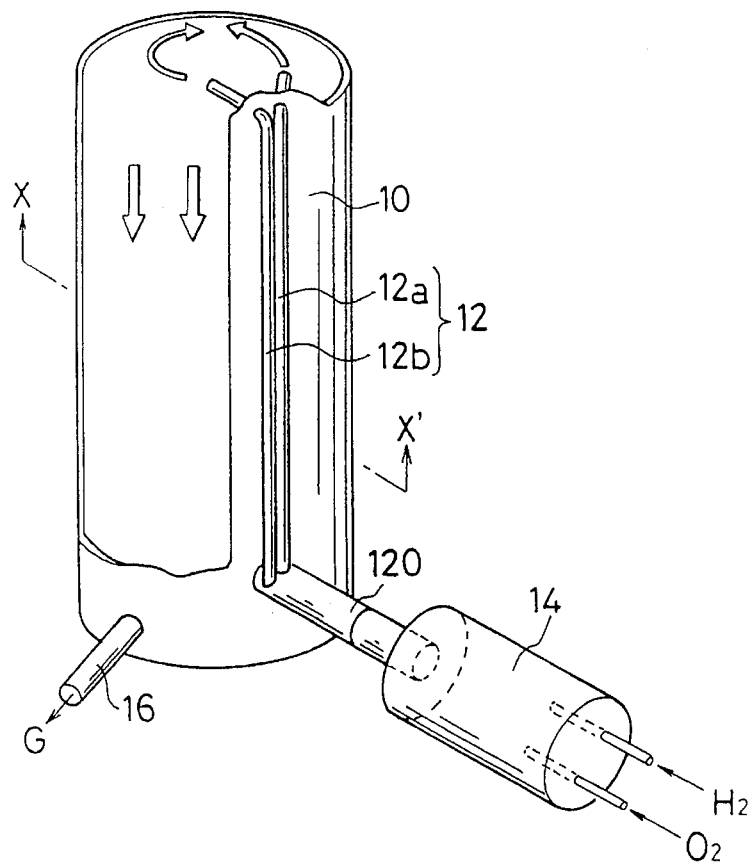
FIG. 3 is a partially broken perspective view of an example of a conventional vertical type heat treatment furnace.
Figure 4:
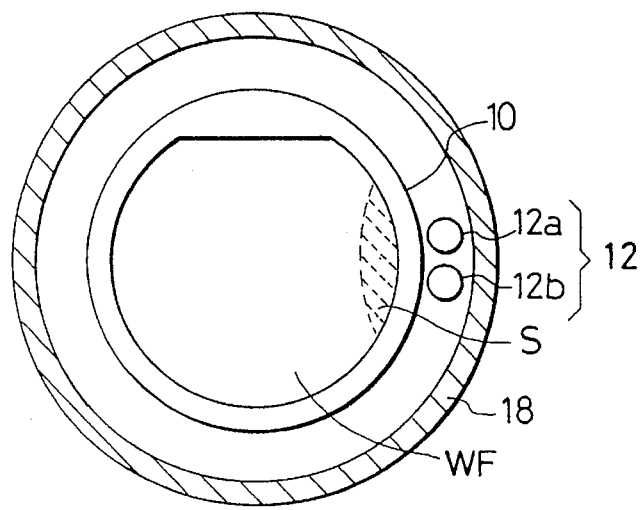
FIG. 4 is a cross sectional view taken along line X—X' of FIG. 3.
Figure 5:
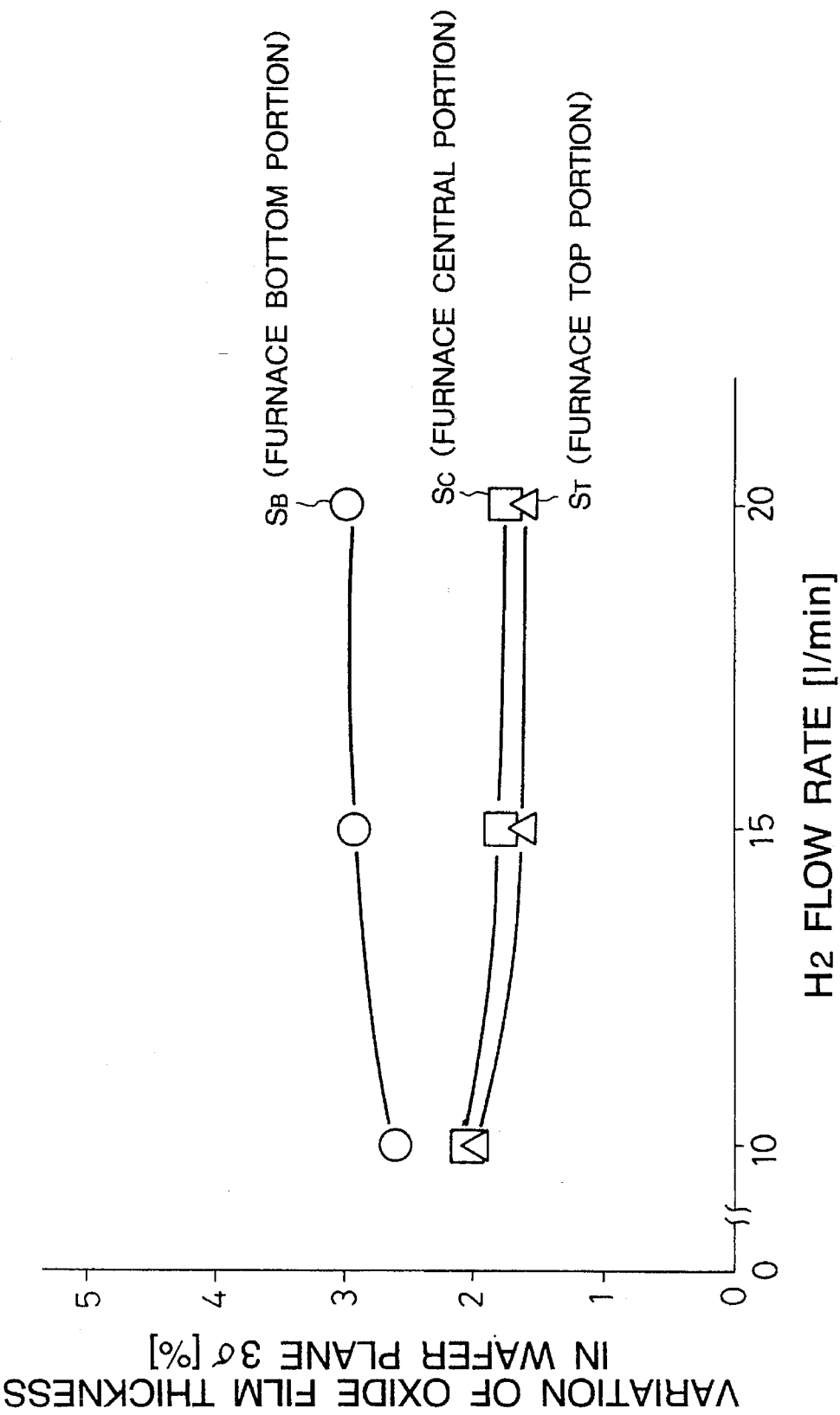
FIG. 5 is a graph showing the relationship between an $H_2$ flow rate under constant mixing rates of $H_2$ and $O_2$ and a variation of oxide film thickness in a wafer plane at an oxidation process.

FIGS. 1A and 1B show a vertical type heat treatment furnace according to an embodiment of the invention. Like elements to those shown in FIGS. 3 and 4 are represented by using identical reference numerals, and the detailed description thereof is omitted. Although a heater for the process tube similar to that shown in FIG. 4 is provided, it is not shown in FIG. 1A.

Referring to FIGS. 1A and 1B, an outer tube 20 is disposed at the outside of a process tube 10 which is an inner tube. The outer tube 20 is partitioned into four parts which are connected to the inner tube 10 to form four gas passages 20A to 20D. The gas supply pipe 20A and gas exhaust pipe 20C face each other, and the gas supply pipe 20B and gas exhaust pipe 20D face each other. A plurality of gas inlet holes Ha which align in a row are formed in the upper side wall of the process tube 10 at the area corresponding to the gas supply pipe 2CA. A plurality of gas outlet holes He which align in a row are formed in the lower side wall of the process tube 10 at the area corresponding to the gas exhaust pipe 20C. A number of gas inlet and outlet holes Hb and Hd which align in a plurality of rows are formed in the side wall of the process tube 10 distributed in the longitudinal direction of the tube at the areas corresponding to the facing gas supply pipe 20B and gas exhaust pipe 20D.

For example, the gas inlet holes Ha and Hb have a diameter of 3 mm and a hole density of one hole per 2 cm square, whereas the gas outlet holes Hc and Hd have a diameter of 6 mm to allow a rapid gas exhaust and a hole density of one hole per 2 cm square.

FIG. 1B is a cross sectional view of the reaction furnace. The hollow inner tube 10 and the hollow outer tube 20 are disposed concentrically. The outer tube 20 is partitioned into axially symmetrical four parts (equally divided quadripartite tubes) 20A to 20D which are connected to the inner tube 10 to form four gas passages.

A processing gas Gi is supplied via a control valve V1 to a lower gas inlet port 20a of the gas supply pipe 20A, and introduced into the process tube 10 via the gas supply pipe 20A and gas inlet holes Ha. Another processing gas Gi is supplied via a control valve V2 and a gas heater 22 to a lower gas inlet port 20b of the gas supply pipe 20B, and introduced into the process tube 10 via the gas supply pipe 20B and gas inlet holes Hb.

By heating the gas with the gas heater 22 so as not to supply a cooled gas (not heated sufficiently) to the gas inlet port 20b and lower the wafer temperature, it becomes possible to prevent the quality of an oxide film from being changed.

The gas in the furnace is exhausted as an exhaust gas Go to an exhaust system via a lower outlet port 20c of the gas exhaust pipe 20C and a control valve V4. The gas in the furnace is also exhausted as an exhaust gas Go to the exhaust system via a lower outlet port 20d of the gas exhaust pipe 20D and a control valve V3.

A controller CNT controls a temperature of the furnace, a gas supply to the furnace, and the like, and in this embodiment, generates control signals VC1 to VC4 for controlling the control valves V1 to V4, a control signal HC for controlling the gas heater 22, and other signals.

Table 1 shows an example of a control sequence to be performed at each oxidation event at the furnace shown in FIGS. 1A and 1B. In Table 1, OP represents a opened state of a control valve, and CL represents a closed state of a control valve.

TABLE 1

| Step | Introduced gas | State of control valve | | | |
|---|---|---|---|---|---|
| | | $V_1$ | $V_2$ | $V_3$ | $V_4$ |
| 1. Wafer load - Preheat | $N_2 + O_2$ | OP | CL | CL | OP |
| 2. Initial oxidation event | $H_2O, O_2, N_2, \ldots$ | CL | OP | OP | CL |
| 3. Middle oxidation event | $H_2O, O_2, N_2, \ldots$ | OP | CL | CL | OP |
| 4. End of oxidation event | $N_2$ | OP | PO | OP | CL |
| 5. Post anneal - Unload | $N_2$ | OP | CL | CL | OP |

At Step 1, $N_2+O_2$ are introduced into the upper space of the process tube 10 by opening the valve V1, and exhausted via the valve V4 from the lower portion of the process tube 10.

At Step 2, gasses of $H_2O$, $O_2$, $N_2$, and the like are introduced into the process tube 10 via a number of gas inlet holes Hb by opening the valve V2, and exhausted via a number of gas outlet holes Hd of the process tube by opening the valve V3.

At Step 3, gasses of $H_2O$, $O_2$, $N_2$, and the like are introduced into the upper space of the process tube 10 by opening the valve V1, and exhausted from the lower portion of the process tube 10 by opening the valve V4.

At Step 4, $N_2$ is introduced into the process tube via the gas inlet holes Ha and Hb by opening the valves V1 and V2, and exhausted via the gas outlet holes Hd of the process tube 10 by opening the valve V3. The oxidizing gas is rapidly replaced by $N_2$ (inert gas) by opening the two valves V1 and V2. Only the valve V2 may be opened. Helium(He) or argon (Ar) may be used as the inert gas for replacing the oxidizing gas.

At Step 5, $N_2$ is introduced into the upper space of the process tube by opening the valve V1, and exhausted from the lower portion of the process tube 10 by opening the valve V4.

With the above-described control sequence, it is possible to start oxidation by rapidly introducing the oxidizing gas at Step 2 and to stop the oxidation by rapidly replacing the gas by $N_2$ at Step 4. It is also possible quickly to make uniform the reaction conditions at the upper, middle, and lower portions of the furnace at the start of oxidation, thereby reducing a process variation.

Since the gas supply pipes 20A and 20B and gas exhaust pipes 20C and 20D are disposed symmetrically with the central axis of the process tube as in the above embodiment, a uniformity of temperature distribution in the wafer plane can be improved.

In the above embodiment, two gas supply pipes and two gas exhaust pipes are used. The number of pipes may be changed as desired.

Figure 2:
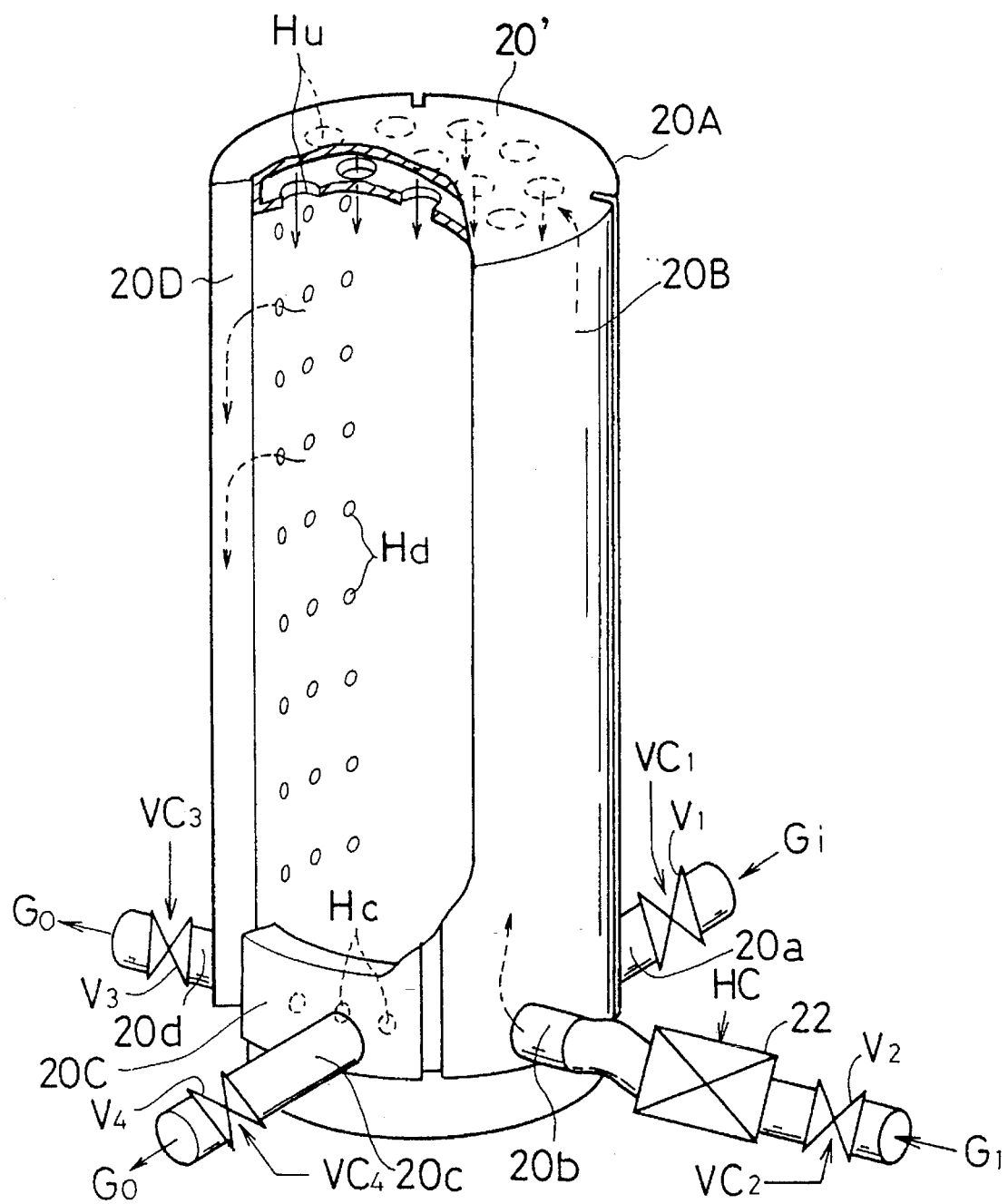
FIG. 2 is a partially broken perspective view of a vertical type heat treatment furnace according to another embodiment.

In the above embodiment, holes Ha are formed in the side wall of the inner tube corresponding in position to the upper area of the outer tube so as to introduce gas into the upper space of the inner tube. Introducing gas into the upper space of the inner tube may be realized by the structure shown in FIG. 2. Like elements to those shown in FIG. 1 are represented by using identical reference numerals, and the detailed description thereof is omitted. In FIG. 2, a hollow lid 20' is coupled to the gas supply pipe 20A and holes Hu are formed in the bottom plate of the hollow lid 20'. For example, the holes have a diameter of 3 mm and a density of one hole per 2 cm square, similar to the embodiment shown in FIG. 1A. The holes may be disposed in a grid or matrix shape or a concentrical shape at an equal angle pitch.

Figure 6:
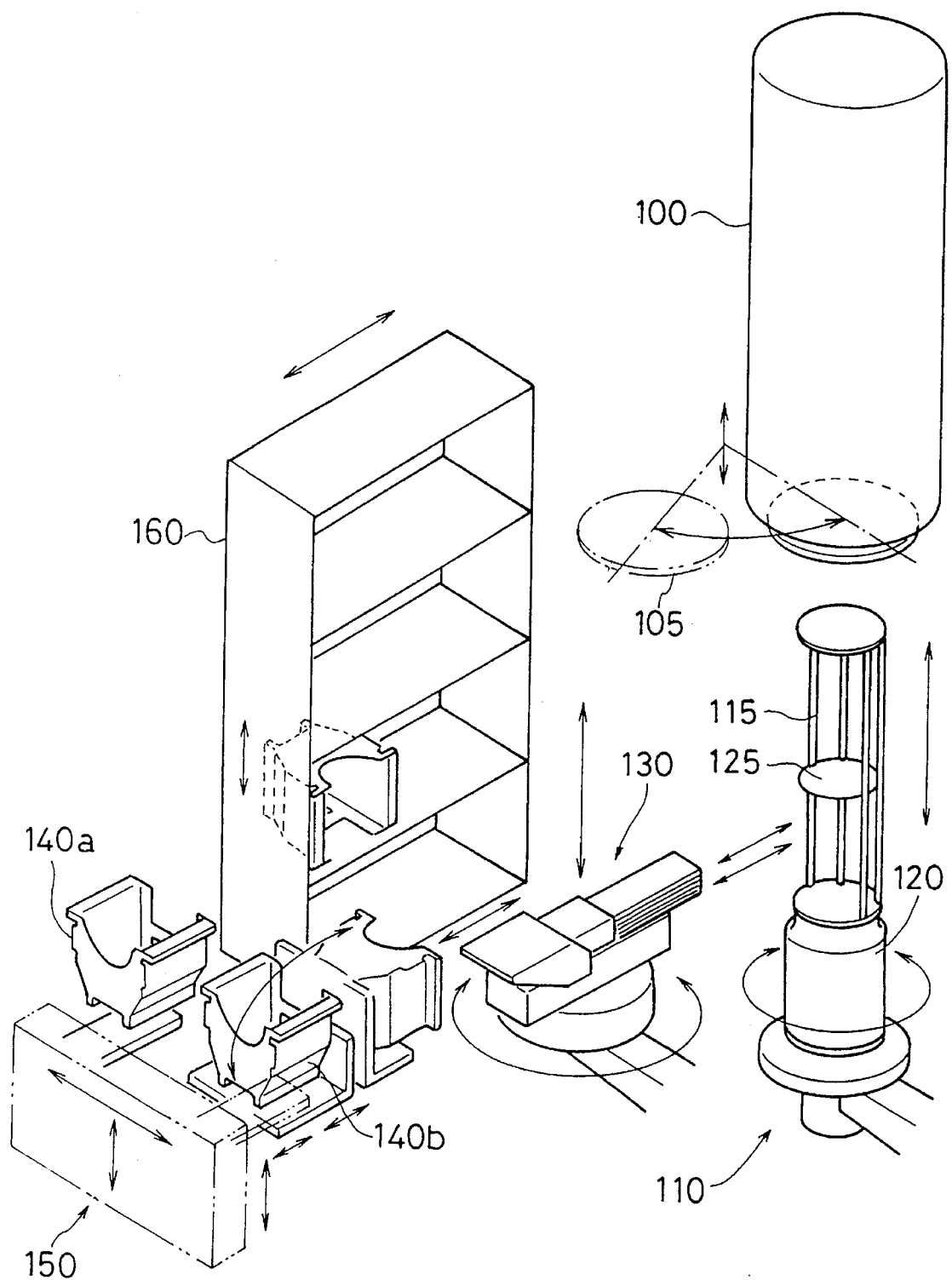
FIG. 6 is a perspective view showing the overall structure of an oxidation process system.

An example of an oxidation process of the embodiment will be described with reference to FIGS. 6 to 8. FIG. 6 is a schematic diagram showing the structure of an oxidation system, and FIGS. 7 and 8 are flow Charts of oxidation processes.

Referring to FIG. 6, a reaction furnace 100 has an inner heater and is fixed in the vertical direction. An opening of the reaction furnace 100 can be closed by an automatic shutter 105. A boat elevator 110 is inserted into the reaction furnace from the bottom thereof. A wafer holder 115 is mounted on a heat block 120 on the boat elevator 110. The wafer holder 115 is formed with slits which are used for supporting a plurality of wafers.

A carrier transfer 130 transports wafer carriers 140a and 140b between an I/O port 150 and a carrier stage 160, picks up wafers from the carrier stage to load it into the boat elevator, or unloads wafers from the boat elevator to transfer it to the carrier stage. The reaction furnace is mounted with the above-described gas supply system, external gas burner, and the like.

FIG. 7 illustrates a series of steps of the oxidation process. A symbol "–" in FIG. 7 means "0".

At a boat unload step, a wafer holder is unloaded.

At a boat cool step, a boat heated to a high temperature is cooled.

At a wafer charge step, wafers are loaded on the boat.

At a boat load step, the wafer loaded boat is placed in the furnace.

At a preheat step, the temperature is raised to a set value and maintained stable. When the wafers are placed in the furnace, the temperature of the furnace is lowered somewhat. At this step, the furnace is preheated for about 30 minutes to raise the temperature to the set value of 800° C.

At a pyrogenic combustion step, an initial oxidation is performed wherein water vapor generated by burning H2 and O2 at the outside of the furnace is exposed to wafers to form uniform oxide films having a target film thickness of 8 nm. A U.S. patent application by the same inventor entitled "Pyrogenic Wet Thermal Oxidation of Semiconductor Wafers" assigned to Yamaha, Corp. filed on the same day as this application, is incorporated herein by reference.

At a wet oxidation step, a gas of $H_2$ is burnt in $O_2$ to generate oxidizing species ($O_2$, water vapor) which are introduced into the furnace to oxidize silicon and form oxide films on the surface thereof at an atmospheric pressure.

At a pyrogenic extinguishment step, combustion for wet oxidation is stopped reliably by first diluting the oxidizing species gas by $N_2$ and then stopping a supply of $H_2$.

At a post anneal step, annealing after the formation of oxide films is performed to reduce electric charges accumulated in the oxide films (such as fixed charges, interface levels, and charge traps).

At a boat unload step, the boat is unloaded.

At a boat cool step, the boat heated to a high temperature is cooled.

At a wafer discharge step, the wafers are dismounted.

At a boat load step, the boat is returned.

In the above embodiments, an oxide film is formed on a silicon substrate. The control sequence Of the embodiments is used, for example, for forming a gate oxide film, a silicon oxynitride ($SiO_xN_y$) film, or the like. A silicon oxynitride film may be used as a tunnel oxide film under a floating gate (control gate) of a flash memory. The control sequence may be used for forming a dielectric film of a capacitor of a DRAM circuit.

FIG. 8 is a diagram showing a series of steps of a sequence of forming a silicon oxynitride film. A symbol "–" in FIG. 8 represents "0". This control sequence has a ramp-up step, two oxynitridation steps (in place of the post anneal step in FIG. 7), and a ramp-down step, which are added to the steps of FIG. 7 after the pyrogenic extinguishment step (3).

The different points from the oxidation sequence shown in FIG. 7 will be described.

At a ramp-up step, a temperature is raised to a value suitable for forming a silicon oxynitride film which is generally formed at a temperature of 850° C. or higher. In this example, the temperature is raised to 950° C. A ramp-down step is a counterpart of the ramp-up step.

At a preheat step, the raised temperature is stabilized.

At an oxinitridation step, a silicon oxynitride film is formed by introducing a $N_2O$ gas. At the first step, a nitrogen atmosphere is rapidly replaced by the $N_2O$ gas by exhausting the nitrogen gas from the side wall from the top to the bottom thereof, and at the second step, a silicon oxynitride film is formed through a down-flow gas supply.

At a post anneal step, the wafer after forming the silicon oxynitride film is annealed so as to reduce electric charges accumulated in the silicon oxynitride film (fixed charge, interface levels, charger traps). The post anneal step is performed twice to first replace the atmosphere with the nitrogen atmosphere at high speed and then provide a down-flow gas supply.

The oxidation sequence shown in FIG. 7 and 8 corresponds to the control sequence of Table 1. Step 1 of the control sequence corresponds to the steps from the wafer charge step to the pyrogenic combustion step up to time t8. Step 2 corresponds to the pyrogenic combustion step from time t8. Step 3 corresponds to the steps from the wet oxidation step to the pyrogenic extinguishment step (2). Step 4 corresponds to the pyrogenic extinguishment (3). Step 5 corresponds to the steps from the post anneal step to the boat unload step.

The present invention has been described in connection with the preferred embodiments.; The invention is not limited only to the above embodiments. It is apparent to those skilled in the art that various modifications, substitutions, combinations and the like can be made without departing from the scope of the appended claims.

I claim:

1. A furnace for manufacturing a semiconductor device, the furnace comprising:

(a) an inner tube for receiving semiconductor wafers, the inner tube including a wall having a plurality of holes therein; and (b) an outer tube having a plurality of outer tube partitions disposed outside of and connected to said wall of the inner tube to jointly define independent gas passages with said wall, the gas passages communicating with the inside of the inner tube through associated holes of the plurality of holes, each of the gas passages serving as one of a gas inlet and a gas outlet.

2. A furnace according to claim 1, wherein the furnace is vertical.

3. A furnace according to claim 1, wherein the gas passages are symmetrically disposed with respect to a center axis of the inner tube.

4. A furnace according to claim 3, wherein the gas passages are coaxially disposed with the inner tube.

5. A furnace according to claim 1, wherein the gas passages include four gas passages and said wall of the inner tube includes a first section, a second section, a third section and a fourth section, each section connected to an associated one of said four gas passages.

6. A furnace according to claim 5, wherein said plurality of holes includes gas holes distributed over entire surfaces of said first and second sections of said wall of the inner tube, wherein the first and second sections oppose each other.

7. A furnace according to claim 6, wherein said gas holes are aligned in a plurality of rows.

8. A furnace according to claim 6, wherein said furnace is a vertical type and said plurality of holes includes gas holes in an upper portion of said third section and gas holes in a lower portion of said fourth section.

9. A furnace according to claim 8, wherein the gas holes of the third and fourth sections are aligned in respective single rows.

10. A furnace according to claim 1, including:
(c) a plurality of valves connected to the gas passages; and
(d) a controller for controlling states of the plurality of valves.

11. A furnace for manufacturing a semiconductor device, the furnace comprising:
(a) an inner tube for receiving semiconductor wafers, the inner tube including a wall having a plurality of holes therein as gas inlets and outlets; and
(b) four outer tube fractions disposed on and coupled to the wall of the inner tube, to define four gas passages which communicate with the inside of the inner tube through the plurality of holes, wherein the gas inlets and outlets formed by said holes are distributed in quadripartite groups corresponding to the four outer tube fractions, each group of the inlets and associated group of outlets being provided on opposing quadripartite positions.

12. A furnace according to claim 11, wherein said holes are grouped into a first pair of gas inlet and outlet and a second pair of gas inlet and outlet.

13. A furnace according to claim 11, wherein the four gas passages are symmetrically disposed with respect to a center axis of the inner tube.

14. A furnace according to claim 13, wherein the four gas passages are coaxially disposed with the inner tube.

15. A furnace according to claim 11, wherein the wall of the inner tube includes a first section, a second section, a third section and a fourth section, each section connected to an associated one of said four gas passages.

16. A furnace according to claim 15, wherein said plurality of holes includes gas holes distributed over entire surfaces of said first and second sections of said wall of the inner tube, wherein the first and second sections oppose each other.

17. A furnace according to claim 16, wherein the gas holes are aligned in a plurality of rows.

18. A furnace according to claim 16, wherein said plurality of holes includes gas holes in an upper portion of said third section and gas holes in a lower portion of said fourth section.

19. A furnace according to claim 16, wherein the gas holes of the third and fourth sections are aligned in respective single rows.

20. A furnace according to claim 11, including:
(c) a plurality of valves connected to the four gas passages; and
(d) a controller for controlling states of the plurality of valves.

21. A furnace for manufacturing a semiconductor device, the furnace comprising:
(a) an inner tube for receiving semiconductor wafers, the inner tube including a wall having a plurality of holes therein;
(b) an outer tube having a plurality of outer tube partitions disposed outside of and connected to said wall of the inner tube to jointly define independent gas passages with said wall, the gas passages communicating with the inside of the inner tube through associated holes of the plurality of holes, each of the gas passages serving as one of a gas inlet and a gas outlet; and
(c) a hollow lid disposed at an upper portion of the inner tube, the hollow lid having a bottom plate, wherein the hollow lid is coupled to at least one of the gas passages, the bottom plate having a plurality of holes therein.

22. The furnace of claim 21, wherein the furnace is a vertical type.

23. A furnace according to claim 21, wherein the gas passages are symmetrically disposed with respect to a center axis of the inner tube.

24. A furnace according to claim 23, wherein the gas passages are coaxially disposed with the inner tube.

25. A furnace according to claim 21, wherein the gas passages include four gas passages and said wall of the inner tube includes a first section, a second section, a third section and a fourth section, each section connected to an associated one of said four gas passages.

26. A furnace according to claim 25, wherein said plurality of holes includes gas holes distributed over entire surfaces of said first and second sections of said wall of the inner tube, wherein the first and second sections oppose each other.

27. A furnace according to claim 26, wherein said gas holes are aligned in a plurality of rows.

28. A furnace according to claim 26, wherein said furnace is a vertical type and said plurality of holes includes gas holes in an upper portion of said third section and gas holes in a lower portion of said fourth section.

29. A furnace according to claim 28, wherein the gas holes of the third and fourth sections are aligned in respective single rows.

30. A furnace according to claim 21, including:
(d) a plurality of valves connected to the gas passages; and
(e) a controller for controlling states of the plurality of valves.

31. A furnace for manufacturing a semiconductor device, the furnace comprising:
(a) an inner tube for receiving semiconductor wafers, the inner tube including a wall having a plurality of holes therein as gas inlets and outlets;
(b) four outer tube fractions disposed on and coupled to the wall of the inner tube, to define four gas passages which communicate with the inside of the inner tube through the plurality of holes, wherein the gas inlets and outlets formed by said holes are distributed in quadripartite groups corresponding to the four outer tube fractions, each group of the inlets and associated group of outlets being provided on opposing quadripartite positions; and (c) a hollow lid disposed at an upper portion of the inner tube, the hollow lid having a bottom plate, wherein the hollow lid is coupled to at least one of the four gas passages, the bottom plate having a plurality of holes therein.

32. The furnace of claim 31, wherein said holes are grouped into a first pair of gas inlet and outlet and a second pair of gas inlet and outlet.

33. A furnace according to claim 31, wherein the four gas passages are symmetrically disposed with respect to a center axis of the inner tube.

34. A furnace according to claim 33, wherein the four gas passages are coaxially disposed with the inner tube.

35. A furnace according to claim 31, wherein the wall of the inner tube includes a first section, a second section, a third section and a fourth section, each section connected to an associated one of said four gas passages.

36. A furnace according to claim 35, wherein said plurality of holes includes gas holes distributed over entire surfaces of said first and second sections of said wall of the inner tube, wherein the first and second sections oppose each other.

37. A furnace according to claim 36, wherein the gas holes are aligned in a plurality of rows.

38. A furnace according to claim 36, wherein said plurality of holes includes gas holes in an upper portion of said third section and gas holes in a lower portion of said fourth section.

39. A furnace according to claim 38, wherein the gas holes of the third and fourth sections are aligned in respective single rows.

40. A furnace according to claim 31, including:

(d) a plurality of valves connected to the four gas passages; and (e) a controller for controlling states of the plurality of valves.

* * * * *